(12) United States Patent
Wu

(10) Patent No.: US 11,303,978 B1
(45) Date of Patent: Apr. 12, 2022

(54) BLUETOOTH SPEAKER AND MANUFACTURING METHOD THEREOF

(71) Applicant: Songjiao Wu, Fuzhou (CN)

(72) Inventor: Songjiao Wu, Fuzhou (CN)

( * ) Notice: Subject to any disclaimer, the term of this patent is extended or adjusted under 35 U.S.C. 154(b) by 0 days.

(21) Appl. No.: 17/485,547

(22) Filed: Sep. 27, 2021

(51) Int. Cl.
    | | |
    |---|---|
    | *H04R 1/02* | (2006.01) |
    | *H05K 1/18* | (2006.01) |
    | *G06F 3/16* | (2006.01) |

(52) U.S. Cl.
    CPC ............ *H04R 1/025* (2013.01); *G06F 3/165* (2013.01); *H04R 1/023* (2013.01); *H04R 1/026* (2013.01); *H04R 1/028* (2013.01); *H05K 1/181* (2013.01); *H04R 2420/07* (2013.01); *H04R 2420/09* (2013.01); *H05K 2201/10083* (2013.01)

(58) Field of Classification Search
    CPC ........ H04R 1/025; H04R 1/023; H04R 1/026; H04R 1/028; H04R 2420/07; H04R 2420/09; G06F 3/165; H05K 1/181; H05K 2201/10083
    USPC ................. 381/116, 117, 332, 334, 336, 386
    See application file for complete search history.

(56) References Cited

U.S. PATENT DOCUMENTS

| | | | | |
|---|---|---|---|---|
| 9,036,858 | B1* | 5/2015 | Reeves | H04R 1/023 381/394 |
| 9,264,791 | B1* | 2/2016 | Polivy | H04R 1/025 |
| 2008/0080734 | A1* | 4/2008 | Forth | B63B 32/70 381/386 |
| 2014/0085093 | A1* | 3/2014 | Mittleman | H04L 12/282 340/628 |
| 2016/0345086 | A1* | 11/2016 | Chamberlin | H04R 1/028 |
| 2016/0345447 | A1* | 11/2016 | Kraz | F16B 21/02 |
| 2021/0281938 | A1* | 9/2021 | Pavelic | H04R 1/028 |

* cited by examiner

*Primary Examiner* — William A Jerez Lora

(57) ABSTRACT

A BLUETOOTH speaker includes a cylindrical shell, a limit ring, a flow guiding mesh plate, a loudspeaker mesh cover, and a flexible sealing rubber ring. The limit ring is arranged on an outer side surface of an upper end of the cylindrical shell. The flow guiding mesh plate is arranged on a bottom portion of the cylindrical shell. The loudspeaker mesh cover is arranged on an upper end of the cylindrical shell. The flexible sealing rubber ring is arranged between the loudspeaker mesh cover and the limit ring. A printed circuit board (PCB) is arranged inside the cylindrical shell. A loudspeaker module is arranged on the PCB. A rechargeable lithium battery is arranged below the PCB. Air guiding grooves are symmetrically arranged on a lower side of the flexible sealing rubber ring.

4 Claims, 4 Drawing Sheets

BLUETOOTH SPEAKER AND MANUFACTURING METHOD THEREOF

TECHNICAL FIELD

The present disclosure relates to a field of BLUETOOTH speaker technology, and in particular to a cup-lid BLUETOOTH speaker capable of do it yourself (DIY) sound cavity and manufacturing method thereof

BACKGROUND

Speakers are widely used in people's lives. BLUETOOTH speakers are mainly portable speakers, which are generally small and portable. BLUETOOTH speaker technology has gradually been valued and accepted by consumers due to its convenient characteristics. Audio equipment with BLUETOOTH connection replaces audio equipment with traditional wire connection. The BLUETOOTH speaker is connected with BLUETOOTH playback devices such as a mobile phone, a tablet, a notebook, etc., which is convenient to sue.

Speakers are generally used directly by consumers after they are purchased. These speaker products have already been assembled by manufacturers, which are difficult to meet people's DIY experience needs. There are also a few speakers that capable of assembling by the users themselves after purchasing. The users need to assemble multiple accessories and parts to complete a speaker. Assembly of these speakers usually adopts a concept of building blocks. However, the users are only able to experience an assembly on a combination of a speaker shell, which cannot satisfy users for personalized sound quality and appearance of speakers. Therefore, the present disclosure provides a cup-lid BLUETOOTH speaker capable of DIY sound cavity and manufacturing method thereof to solve problems in the prior art.

SUMMARY

In view of the above-mentioned problems, a purpose of the present disclosure is to provide a cup-lid BLUETOOTH speaker capable of DIY sound cavity and manufacturing method thereof. The cup-lid BLUETOOTH speaker can be placed on a cup or a bottle. The cup or the bottle is used as a sound cavity to form a speaker. Users are capable of using cups or bottles with different cavity sizes and materials to DIY personalized speakers with different sound quality to meet user's DIY experience needs. The cup-lid BLUETOOTH speaker of the present disclosure is simple in assembly structure, convenient in disassembly and assembly, and is convenient to replace different cavities, which reduces use cost and avoids resource waste.

In order to achieve the purpose of the present disclosure, the present disclosure provides a BLUETOOTH speaker. The BLUETOOTH speaker comprises a cylindrical shell, a limit ring, a flow guiding mesh plate, a loudspeaker mesh cover, and a flexible sealing rubber ring. The limit ring is arranged on an outer side surface of an upper end of the cylindrical shell. The flow guiding mesh plate is arranged on a bottom portion of the cylindrical shell. The loudspeaker mesh cover is arranged on an upper end of the cylindrical shell. The flexible sealing rubber ring is arranged between the loudspeaker mesh cover and the limit ring. A printed circuit board (PCB) is arranged inside the cylindrical shell. A loudspeaker module is arranged on the PCB; a rechargeable lithium battery is arranged below the PCB. Air guiding grooves are symmetrically arranged on a lower side of the flexible sealing rubber ring. A bottle body is arranged under the cylindrical shell. An upper edge of the bottle body abuts against the lower side of the flexible sealant rubber ring.

Furthermore, a BLUETOOTH connecting module is arranged on the PCB. A USB charging port is arranged on the PCB. The USB charging port runs through one side of the cylindrical shell. The loudspeaker module and the rechargeable lithium battery are electrically connected to the PCB through a plug-in wiring.

Furthermore, adjusting air guiding openings are symmetrically defining on the flexible sealing rubber ring. A flexible air guiding cover is rotatably arranged on one side of each of the adjusting air guiding openings. The adjusting air guiding openings are symmetrically provided with two pairs and the air guiding grooves are symmetrically provided with four pairs.

Furthermore, the flow guiding mesh plate is installed on the bottom portion of the cylindrical shell through a clamping groove. The loudspeaker mesh cover is threadedly connected with the upper end of the cylindrical shell.

The present disclosure further provides a manufacturing method of the BLUETOOTH speaker. The manufacturing method comprises steps:

step 1: adding stabilizer to polyvinyl chloride material to obtain a mixture; mixing the mixture evenly and heating the mixture to a molten state; then quickly pouring the mixture separately into an injection mold of the cylindrical shell, an injection mold of the flow guiding mesh plate, and an injection mold of the loudspeaker mesh cover to obtain an injection-molded cylindrical shell, an injection-molded flow guiding mesh plate, and an injection-molded loudspeaker mesh cover;

step 2: demolding and quickly cooling the injection-molded cylindrical shell, the injection-molded flow guiding mesh plate, and the injection-molded loudspeaker mesh cover; and trimming excess parts of the injection-molded cylindrical shell, excess parts of the injection-molded flow guiding mesh plate, and excess parts of the injection-molded loudspeaker mesh cover to obtain the cylindrical shell, the flow guiding mesh plate, and the loudspeaker mesh cover;

step 3: pouring chloroprene rubber into a mold of the flexible sealing rubber ring to obtain a molded flexible sealing rubber ring; repeating pouring the chloroprene rubber into a mold of the flexible air guiding cover to obtain molded flexible air guiding covers; taking out the molded flexible sealing rubber ring and the molded flexible air guiding covers; vulcanizing the molded flexible sealing rubber ring and the molded flexible air guiding covers to obtain the flexible sealing rubber ring and the flexible air guiding covers; cooling the flexible sealing rubber ring and the flexible air guiding covers;

step 4: installing the flow guiding mesh plate on the bottom portion of the cylindrical shell, and then installing the rechargeable lithium battery, the PCB, and the loudspeaker module inside the cylindrical shell in sequence, and connecting the rechargeable lithium battery, the PCB, and the loudspeaker module through plug-in wiring; and step 5: sleeving the flexible sealing rubber ring on the limit ring of the cylindrical shell; installing and tightening the loudspeaker mesh cover threadedly on the cylindrical shell; sandwiching the flexible sealing rubber ring between the limit ring and the loudspeaker mesh cover; installing the flexible air guiding covers on adjusting air guiding openings of the flexible sealing rubber ring.

Furthermore, the stabilizer in the step 1 comprises a light stabilizer and a heat stabilizer. During a trimming process in step 2, a hole corresponding to a USB charging port is opened at a corresponding position on one side of the cylindrical shell.

Furthermore, in the step 3, a temperature of the chloroprene rubber during polymerization and molding is controlled at 40-60° C. There is no air inside the mold of the flexible sealing rubber ring and the mold of the flexible air guiding cover during polymerization and molding.

The cup-lid BLUETOOTH speaker of the present disclosure is able to be placed on the cup or the bottle. The cup or the bottle is used as the sound cavity to form the cup-lid BLUETOOTH speaker. Users are capable of using cups or bottles with different cavity sizes and materials to DIY personalized speakers with different sound quality to meet user's DIY experience needs. The cup-lid BLUETOOTH speaker of the present disclosure is simple in assembly structure, convenient in disassembly and assembly, and is convenient to replace different cavities, which reduces use cost and avoids resource waste.

1—cylindrical shell; 2—limit ring; 3—flow guiding mesh plate; 4—loudspeaker mesh cover; 5—flexible sealing rubber ring; 6—PCB; 7—loudspeaker module; 8—rechargeable lithium battery 9—air guiding groove; 10—BLUETOOTH connecting module; 11—USB charging port; 12—adjusting air guiding port; 13—flexible air guiding cover; 14—bottle; 15—cup.

DETAILED DESCRIPTION

In order to deepen the understanding of the present disclosure, the present disclosure will be described in further detail below in conjunction with embodiments. The embodiments are only used to explain the present disclosure and do not intend to limit the protection scope of the present disclosure.

Embodiment 1

Figure 1:
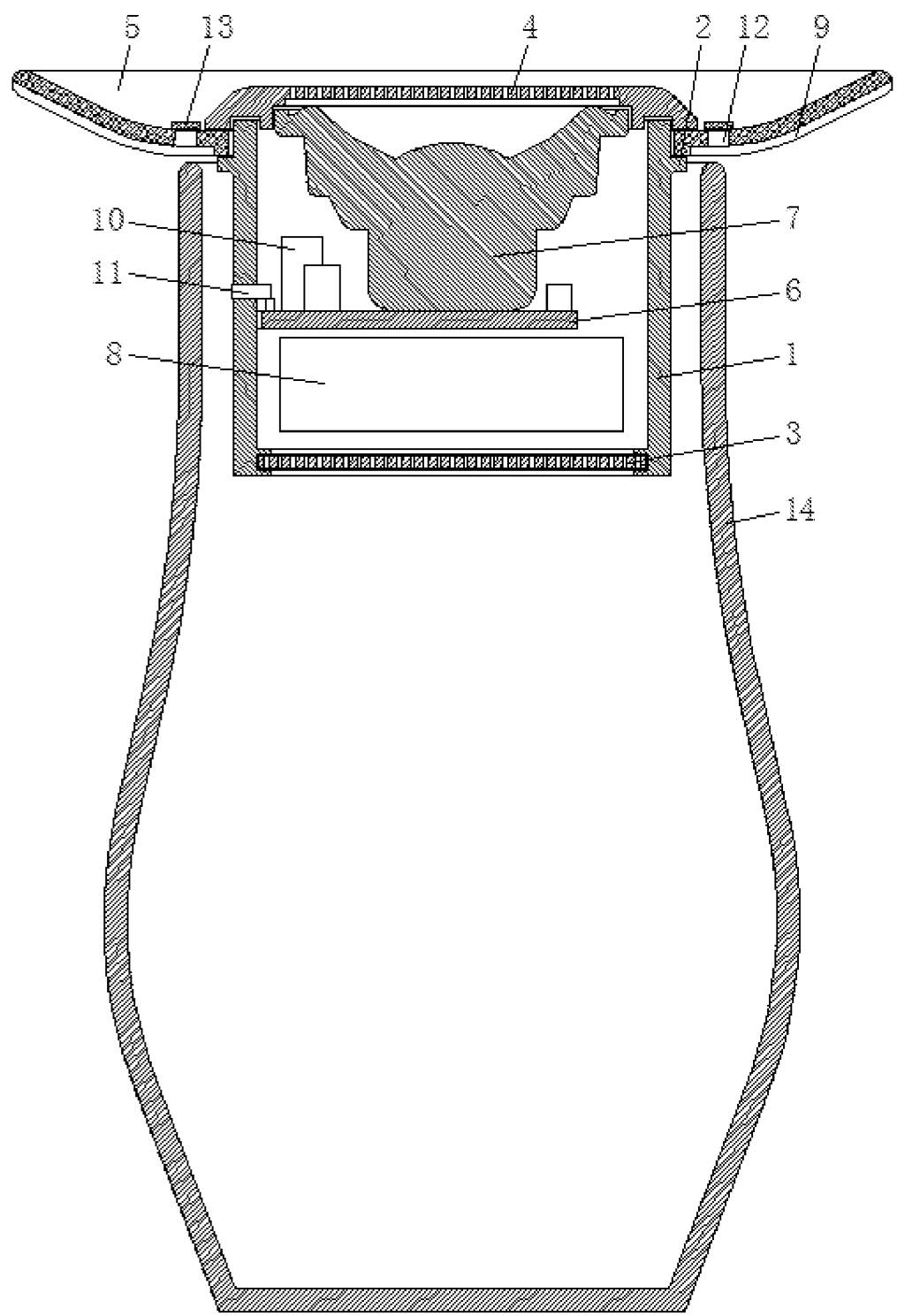
FIG. 1 is a cross-sectional view of a cup-lid BLUETOOTH speaker according to embodiment 1 of the present disclosure.
Figure 3:
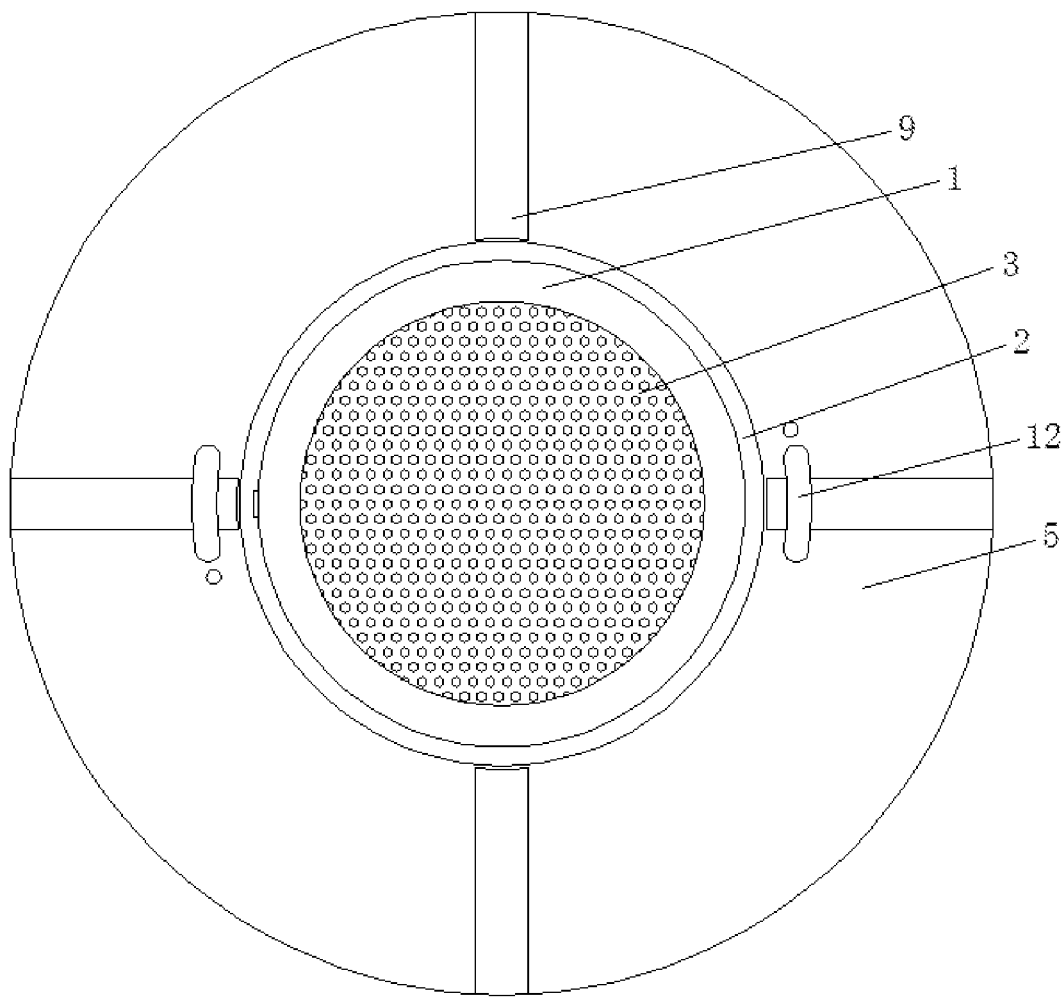
FIG. 3 is a bottom elevational view of the cup-lid BLUETOOTH speaker of the present disclosure.
Figure 4:
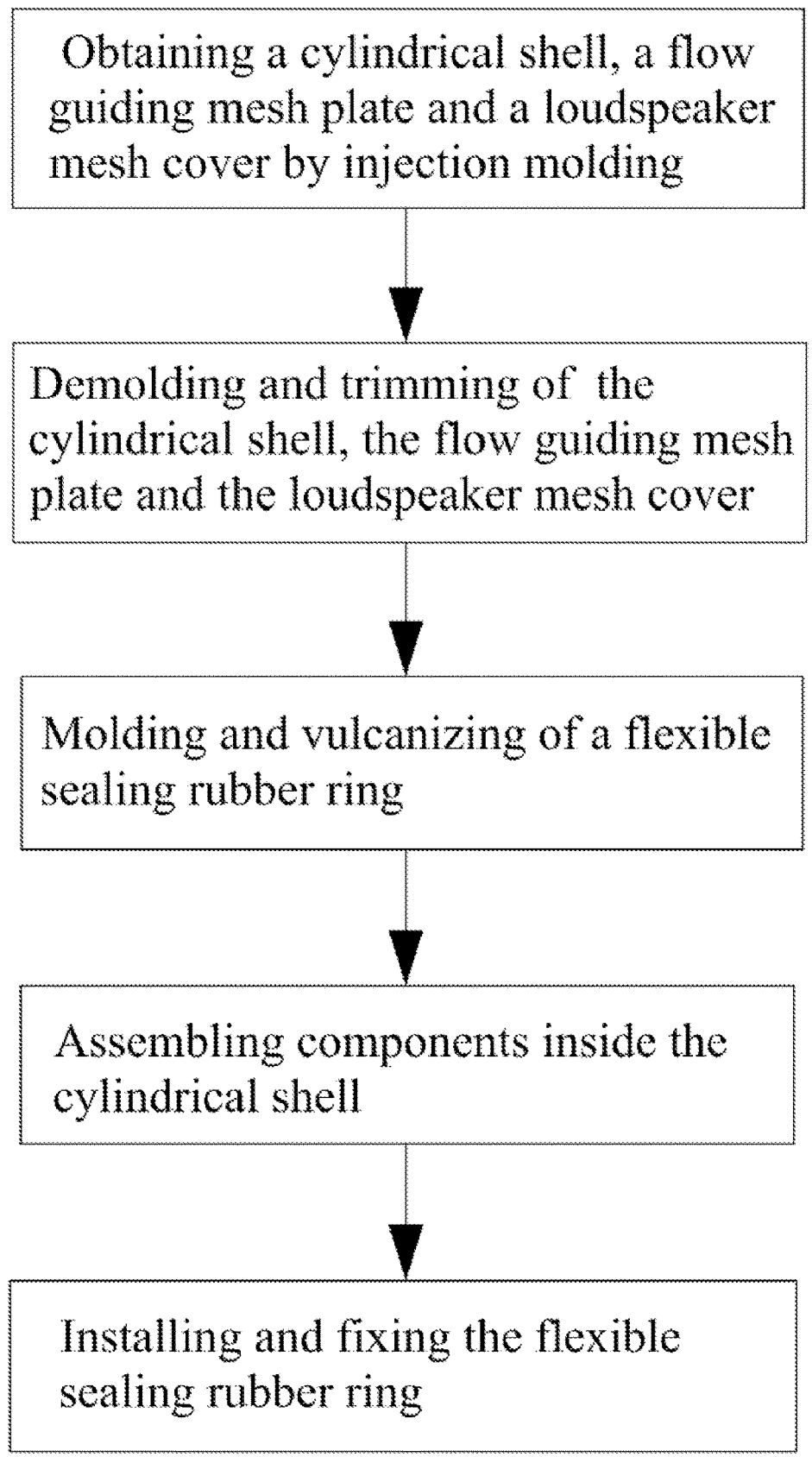
FIG. 4 is a manufacturing flow chart of the cup-lid BLUETOOTH speaker of the present disclosure.

As shown in FIGS. 1, 3 and 4, the present disclosure provides a cup-lid BLUETOOTH speaker capable of do it yourself (DIY) sound cavity and a manufacturing method thereof. The cup-lid BLUETOOTH speaker capable of DIY sound cavity comprises a cylindrical shell 1, a limit ring 2, a flow guiding mesh plate 3, a loudspeaker mesh cover 4, and a flexible sealing rubber ring 5. The limit ring 2 is arranged on an outer side surface of an upper end of the cylindrical shell 1. The flow guiding mesh plate 3 is arranged on a bottom portion of the cylindrical shell 1. The flow guiding mesh plate 3 guides sounds to the sound cavity. The loudspeaker mesh cover 4 is arranged on an upper end of the cylindrical shell 1. The flexible sealing rubber ring 5 is arranged between the loudspeaker mesh cover 4 and the limit ring 2. A printed circuit board (PCB) 6 is arranged inside the cylindrical shell 1. A loudspeaker module 7 is arranged on the PCB 6. A rechargeable lithium battery 8 is arranged below the PCB 6. Air guiding grooves 9 are symmetrically arranged on a lower side of the flexible sealing rubber ring 5. A bottle body is arranged under the cylindrical shell 1. An upper edge of the bottle body abuts against the lower side of the flexible sealant rubber ring 5. In the embodiment, the bottle body is a bottle 14 made of A BLUETOOTH connecting module 10 is arranged on the PCB 6. A USB charging port 11 is arranged on the PCB 6. The USB charging port 11 run through one side of the cylindrical shell 1. The loudspeaker module 7 and the rechargeable lithium battery 8 are electrically connected to the PCB 6 through a plug-in wiring.

Adjusting air guiding openings 12 are symmetrically defining on the flexible sealing rubber ring 5. A flexible air guiding cover 13 is rotatably arranged on one side of each of the adjusting air guiding openings 12. The adjusting air guiding openings 12 are symmetrically provided with two pairs and the air guiding grooves 9 are symmetrically provided with four pairs.

The flow guiding mesh plate 3 is installed on the bottom portion of the cylindrical shell 1 through a clamping groove. The loudspeaker mesh cover 4 is threadedly connected with the upper end of the cylindrical shell 1.

The present disclosure further provides a manufacturing method of the BLUETOOTH speaker. The manufacturing method comprises steps:

Step 1: adding stabilizer to polyvinyl chloride material to obtain a mixture; mixing the mixture evenly and heating the mixture to a molten state; then quickly pouring the mixture separately into an injection mold of the cylindrical shell, an injection mold of the flow guiding mesh plate, and an injection mold of the loudspeaker mesh cover to obtain an injection-molded cylindrical shell, an injection-molded flow guiding mesh plate, and an injection-molded loudspeaker mesh cover; the stabilizer comprises a light stabilizer and a heat stabilizer;

Step 2: demolding and quickly cooling the injection-molded cylindrical shell, the injection-molded flow guiding mesh plate, and the injection-molded loudspeaker mesh cover; and trimming excess parts of the injection-molded cylindrical shell, excess parts of the injection-molded flow guiding mesh plate, and excess parts of the injection-molded loudspeaker mesh cover to obtain the cylindrical shell, the flow guiding mesh plate, and the loudspeaker mesh cover; during a trimming process in a hole corresponding to a USB charging port is opened at a corresponding position on one side of the cylindrical shell;

Step 3: pouring chloroprene rubber into a mold of the flexible sealing rubber ring to obtain a molded flexible sealing rubber ring; repeating pouring the chloroprene rubber into a mold of the flexible air guiding cover to obtain molded flexible air guiding covers; taking out the molded flexible sealing rubber ring and the molded flexible air guiding covers; vulcanizing the molded flexible sealing rubber ring and the molded flexible air guiding covers to obtain the flexible sealing rubber ring and the flexible air guiding covers; cooling the flexible sealing rubber ring and the flexible air guiding covers; a temperature of the chloroprene rubber during polymerization and molding is controlled at 45° C.; There is no air inside the mold of the flexible sealing rubber ring and the mold of the flexible air guiding cover during polymerization and molding.

Step 4: installing the flow guiding mesh plate on the bottom portion of the cylindrical shell, and then installing the rechargeable lithium battery, the PCB, and the loudspeaker module inside the cylindrical shell in sequence, and connecting the rechargeable lithium battery, the PCB, and the loudspeaker module through plug-in wiring; and Step 5: sleeving the flexible sealing rubber ring on the limit ring of the cylindrical shell; installing and tightening the loudspeaker mesh cover threadedly on the cylindrical shell; sandwiching the flexible sealing rubber ring between the limit ring and the loudspeaker mesh cover; installing the flexible air guiding covers on adjusting air guiding openings of the flexible sealing rubber ring.

Embodiment 2

Figure 2:
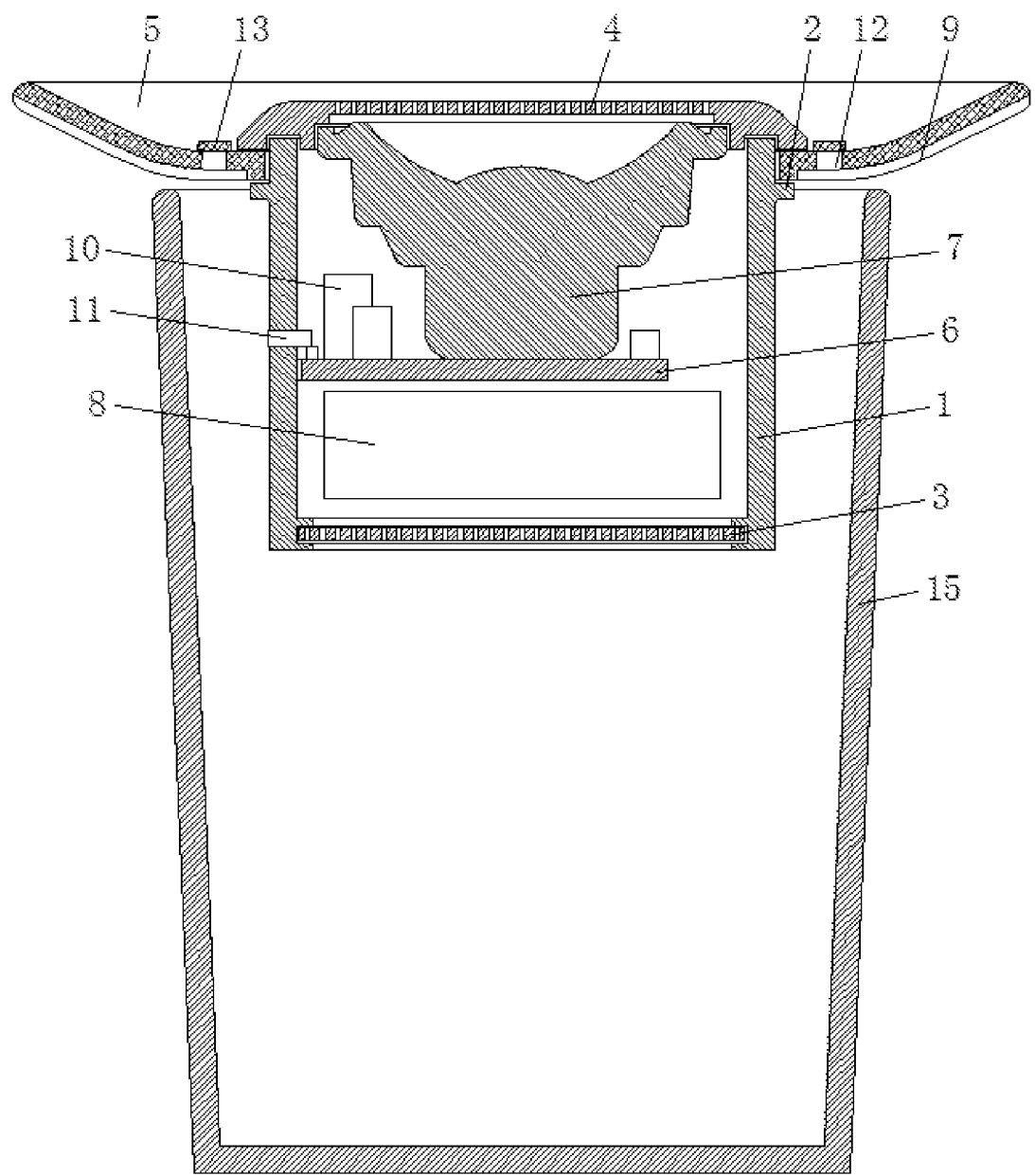
FIG. 2 is a cross-sectional view of the cup-lid BLUETOOTH speaker according to embodiment 2 of the present disclosure.

As shown in FIGS. 2-4, the present disclosure provides a cup-lid BLUETOOTH speaker capable of DIY sound cavity and a manufacturing method thereof. The BLUETOOTH speaker comprises a cylindrical shell 1, a limit ring 2, a flow guiding mesh plate 3, a loudspeaker mesh cover 4, and a flexible sealing rubber ring 5. The limit ring 2 is arranged on an outer side surface of an upper end of the cylindrical shell 1. The flow guiding mesh plate 3 is arranged on a bottom portion of the cylindrical shell 1. The flow guiding mesh plate 3 guides sounds to the sound cavity. The loudspeaker mesh cover 4 is arranged on an upper end of the cylindrical shell 1. The flexible sealing rubber ring 5 is arranged between the loudspeaker mesh cover 4 and the limit ring 2. A printed circuit board (PCB) 6 is arranged inside the cylindrical shell 1. A loudspeaker module 7 is arranged on the PCB 6. A rechargeable lithium battery 8 is arranged below the PCB 6. Air guiding grooves 9 are symmetrically arranged on a lower side of the flexible sealing rubber ring 5. A bottle body is arranged under the cylindrical shell 1. An upper edge of the bottle body abuts against the lower side of the flexible sealant rubber ring 5. In the embodiment, the bottle body is a cup 15.

A BLUETOOTH connecting module 10 is arranged on the PCB 6. A USB charging port 11 is arranged on the PCB 6. The USB charging port 11 run through one side of the cylindrical shell 1. The loudspeaker module 7 and the rechargeable lithium battery 8 are electrically connected to the PCB 6 through a plug-in wiring.

Adjusting air guiding openings 12 are symmetrically defining on the flexible sealing rubber ring 5. A flexible air guiding cover 13 is rotatably arranged on one side of each of the adjusting air guiding openings 12. The adjusting air guiding openings 12 are symmetrically provided with two pairs and the air guiding grooves 9 are symmetrically provided with four pairs.

The flow guiding mesh plate 3 is installed on the bottom portion of the cylindrical shell 1 through a clamping groove. The loudspeaker mesh cover 4 is threadedly connected with the upper end of the cylindrical shell 1.

The present disclosure further provides a manufacturing method of the BLUETOOTH speaker. The manufacturing method comprises steps:

Step 1: adding stabilizer to polyvinyl chloride material to obtain a mixture; mixing the mixture evenly and heating the mixture to a molten state; then quickly pouring the mixture separately into an injection mold of the cylindrical shell, an injection mold of the flow guiding mesh plate, and an injection mold of the loudspeaker mesh cover to obtain an injection-molded cylindrical shell, an injection-molded flow guiding mesh plate, and an injection-molded loudspeaker mesh cover; the stabilizer comprises a light stabilizer and a heat stabilizer;

Step 2: demolding and quickly cooling the injection-molded cylindrical shell, the injection-molded flow guiding mesh plate, and the injection-molded loudspeaker mesh cover; and trimming excess parts of the injection-molded cylindrical shell, excess parts of the injection-molded flow guiding mesh plate, and excess parts of the injection-molded loudspeaker mesh cover to obtain the cylindrical shell, the flow guiding mesh plate, and the loudspeaker mesh cover; during a trimming process in a hole corresponding to a USB charging port is opened at a corresponding position on one side of the cylindrical shell;

Step 3: pouring chloroprene rubber into a mold of the flexible sealing rubber ring to obtain a molded flexible sealing rubber ring; repeating pouring the chloroprene rubber into a mold of the flexible air guiding cover to obtain molded flexible air guiding covers; taking out the molded flexible sealing rubber ring and the molded flexible air guiding covers; vulcanizing the molded flexible sealing rubber ring and the molded flexible air guiding covers to obtain the flexible sealing rubber ring and the flexible air guiding covers; cooling the flexible sealing rubber ring and the flexible air guiding covers;

A temperature of the chloroprene rubber during polymerization and molding is controlled at 55° C.; There is no air inside the mold of the flexible sealing rubber ring and the mold of the flexible air guiding cover during polymerization and molding.

Step 4: installing the flow guiding mesh plate on the bottom portion of the cylindrical shell; and then installing the rechargeable lithium battery, the PCB, and the loudspeaker module inside the cylindrical shell in sequence, and connecting the rechargeable lithium battery, the PCB, and the loudspeaker module through plug-in wiring; and Step 5: sleeving the flexible sealing rubber ring on the limit ring of the cylindrical shell; installing and tightening the loudspeaker mesh cover threadedly on the cylindrical shell; sandwiching the flexible sealing rubber ring between the limit ring and the loudspeaker mesh cover; installing the flexible air guiding covers on adjusting air guiding openings of the flexible sealing rubber ring.

The cup-lid BLUETOOTH speaker capable of DIY sound cavity of the present disclosure is able to be placed on a cup or a bottle. The cup or the bottle is used as a sound cavity to form a speaker. Users are capable of using cups or bottles with different cavity sizes and materials to DIY personalized speakers with different sound quality to meet user's DIY experience needs. The cup-lid BLUETOOTH speaker of the present disclosure is simple in assembly structure, convenient in disassembly and assembly, and is convenient to replace different cavities, which reduces use cost and avoids resource waste.

Basic principles, main features, and advantages of the present disclosure have been shown and described above. Those skilled in the field should understand that the present disclosure is not limited by the foregoing embodiments. The foregoing embodiments and descriptions only illustrate the principles of the present disclosure. Without departing from the spirit and scope of the present disclosure, the present disclosure may have various changes and improvements, which shall fall within the scope of the present disclosure. The scope of protection claimed by the present disclosure is defined by the appended claims and their equivalents.

What is claimed is:

1. A BLUETOOTH speaker, comprising:
a cylindrical shell;
a limit ring;
a flow guiding mesh plate;
a loudspeaker mesh cover; and
a flexible sealing rubber ring;

wherein the limit ring is arranged on an outer side surface of an upper end of the cylindrical shell; the flow guiding mesh plate is arranged on a bottom portion of the cylindrical shell; the loudspeaker mesh cover is arranged on an upper end of the cylindrical shell; the flexible sealing rubber ring is arranged between the loudspeaker mesh cover and the limit ring; a printed circuit board (PCB) is arranged inside the cylindrical shell; a loudspeaker module is arranged on the PCB; a rechargeable lithium battery is arranged below the PCB; air guiding grooves are symmetrically arranged on a lower side of the flexible sealing rubber ring; a bottle body is arranged under the cylindrical shell; an upper edge of the bottle body abuts against the lower side of the flexible sealant rubber ring.

2. The BLUETOOTH speaker according to claim 1, wherein a BLUETOOTH connecting module is arranged on the PCB; a USB charging port is arranged on the PCB, the USB charging port runs through one side of the cylindrical shell; the loudspeaker module and the rechargeable lithium battery are electrically connected to the PCB through a plug-in wiring.

3. The BLUETOOTH speaker according to claim 1, wherein adjusting air guiding openings are symmetrically defining on the flexible sealing rubber ring; a flexible air guiding cover is rotatably arranged on one side of each of the adjusting air guiding openings; the adjusting air guiding openings are symmetrically provided with two pairs and the air guiding grooves are symmetrically provided with four pairs.

4. The BLUETOOTH speaker according to claim 1, wherein the flow guiding mesh plate is installed on the bottom portion of the cylindrical shell through a clamping groove; the loudspeaker mesh cover is threadedly connected with the upper end of the cylindrical shell.

* * * * *